United States Patent
Saito

(10) Patent No.: US 7,358,886 B2
(45) Date of Patent: Apr. 15, 2008

(54) VOLTAGE OUTPUT DIGITAL-TO-ANALOG CONVERTER CIRCUIT

(75) Inventor: Asami Saito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/609,549

(22) Filed: Dec. 12, 2006

(65) Prior Publication Data

US 2007/0132622 A1 Jun. 14, 2007

(30) Foreign Application Priority Data

Dec. 12, 2005 (JP) ............................. 2005-357713

(51) Int. Cl.
*H03M 1/78* (2006.01)
(52) U.S. Cl. ...................................... 341/154; 341/144
(58) Field of Classification Search ......... 341/144–160
See application file for complete search history.

(56) References Cited

U.S. PATENT DOCUMENTS

| 5,764,174 A | 6/1998 | Dempsey et al. |
| 6,404,274 B1 * | 6/2002 | Hosono et al. ............. 327/538 |
| 6,960,931 B2 * | 11/2005 | Turcotte ..................... 326/30 |

* cited by examiner

*Primary Examiner*—Lam T. Mai
(74) *Attorney, Agent, or Firm*—Banner & Witcoff, Ltd.

(57) ABSTRACT

According to this invention, there is provided a voltage output digital-to-analog converter circuit, including other ones of the second resistive elements and third resistive elements having a desired resistance value are series-connected between the other ends of the second resistive elements, which are connected to switching elements of the plurality of switching elements to which a most significant bit and a least significant bit are supplied, and the ground.

20 Claims, 3 Drawing Sheets

VOLTAGE OUTPUT DIGITAL-TO-ANALOG CONVERTER CIRCUIT

CROSS REFERENCE TO RELATED APPLICATIONS

This application is based upon and claims the benefit of priority under 35 USC 119 from the Japanese Patent Application No. 2005-357713, filed on Dec. 12, 2005, the entire contents of which are incorporated herein by reference.

BACKGROUND OF THE INVENTION

The present invention relates to a voltage output digital-to-analog converter circuit.

A voltage output digital-to-analog converter circuit has a plurality of switching elements which switch their connection states according to respective bits of an input digital signal and a resistor network formed by connecting, in a so-called "ladder-type" manner, resistors of two types which are selected such that the ratio between their resistance values is 1:2.

The voltage output digital-to-analog converter circuit switches the connection state of each switching element to the reference voltage terminal or the ground terminal according to a digital signal input as a corresponding bit and divides the reference voltage using the resistor network, thereby generating an output voltage corresponding to the input digital signal, i.e., an output analog signal (see, e.g., Toshikazu Yoneyama, "Introduction to A/D Converters", Ohmsha, Ltd., pp. 139-140).

Each switching element is formed by, e.g., connecting a source of PMOS transistor and a source of NMOS transistor to the reference voltage terminal and the ground terminal respectively. Each of the PMOS transistor and NMOS transistor generates an on-resistance having a certain resistance value using a MOS transistor when it is on.

For this reason, if the PMOS transistor connected to the reference voltage terminal is turned on, the NMOS transistor connected to the ground terminal is turned off, and the reference voltage is selected, a problem arises. More specifically, since the PMOS transistor has the on-resistance, the on-resistance is series-connected to the resistor connected to the switching element, and an error occurs in the output voltage, i.e., analog signal.

SUMMARY OF THE INVENTION

A voltage output digital-to-analog converter circuit according to one aspect of the present invention includes a plurality of switching elements provided corresponding to respective bits of an input digital signal to switch connection states of the plurality of switching elements to either the reference voltage terminal or the ground terminal according to the bits of the digital signal; and a resistor network which includes first resistive elements and second resistive elements having a resistance value twice a resistance value of the first resistive elements and in which one ends of the second resistive elements are connected to the plurality of switching elements respectively, the first resistive elements are connected between neighboring pairs of the other ends of the second resistive elements respectively, and other ones of the second resistive elements and third resistive elements having a desired resistance value are series-connected between the other ends of the second resistive elements, which are connected to switching elements of the plurality of switching elements to which a most significant bit and a least significant bit are supplied, and the ground.

DETAILED DESCRIPTION OF THE INVENTION

Hereafter, embodiments of the present invention will be described more specifically with reference to the drawings.

First Embodiment

Figure 1:
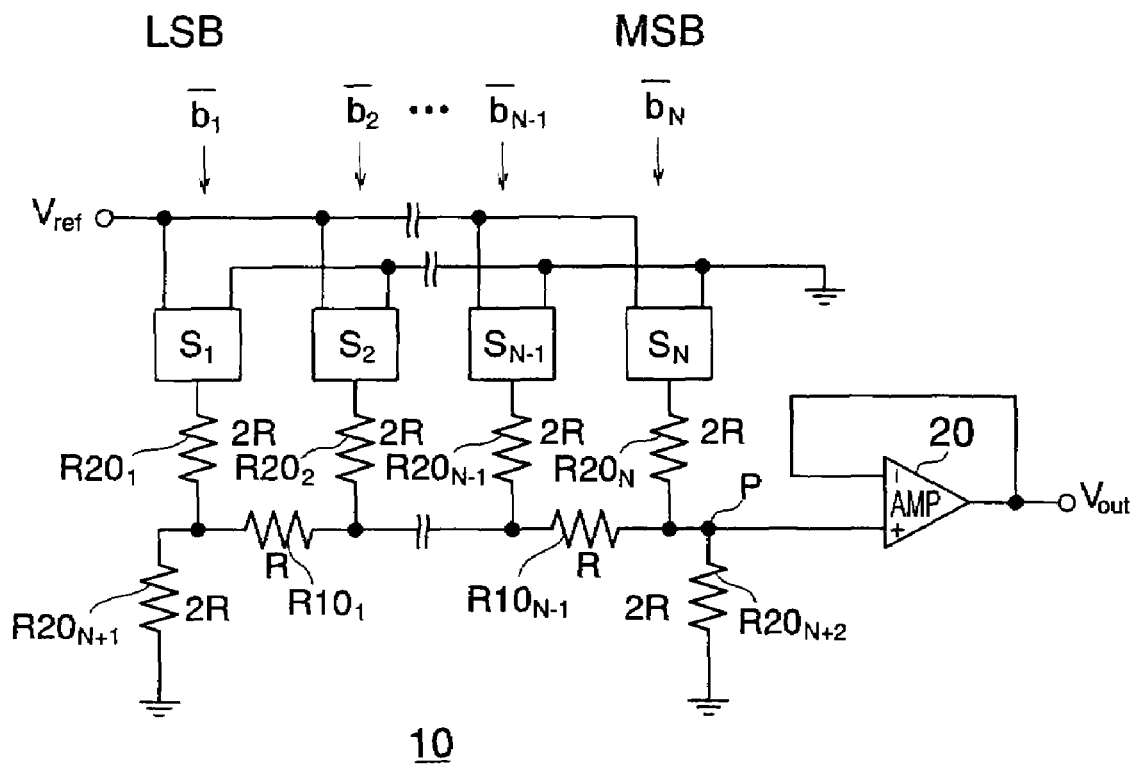
FIG. 1 is a block diagram showing the basic configuration of a voltage output digital-to-analog converter circuit.

FIG. 1 shows the basic configuration of a voltage output digital-to-analog converter circuit 10. The voltage output digital-to-analog converter circuit 10 has a plurality of switching elements $S_1$ to $S_N$ provided corresponding to respective bits of an input digital signal. The switching elements $S_1$ to $S_N$ switch their connection states according to the bits of the digital signal.

More specifically, if a corresponding one of the bits of the input digital signal which is supplied to each of the switching elements $S_1$ to $S_N$ is data "1", the switching element switches its connection state to the reference voltage terminal "$V_{ref}$", thereby selecting the reference voltage "$V_{ref}$". On the other hand, if the corresponding bit is data "0", the switching element switches its connection state to the ground terminal (GND), thereby selecting 0 V.

Note that in this embodiment, a digital signal input as bits $b_1$ (LSB) to $b_N$ (MSB) is inverted by inverters (not shown), and inverted data/$b_1$ is input to the switching element $S_1$, and data/$b_2$ is input to the switching element $S_2$. Similarly, data/$b_{N-1}$ is input to the switching element $S_{N-1}$, and data/$b_N$ is input to the switching element $S_N$.

Figure 2:
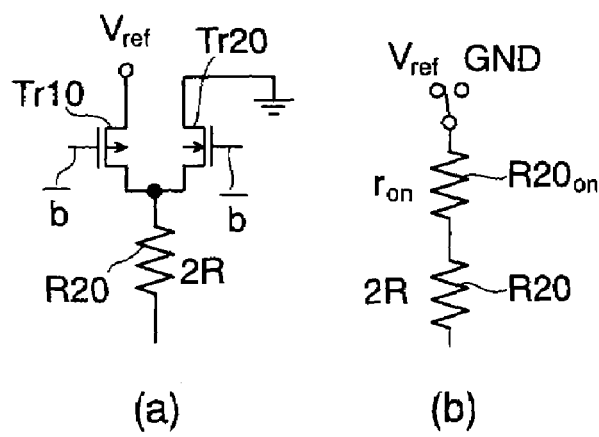
FIG. 2 are circuit diagrams each showing the circuit configuration of a switching element.

FIG. 2(a) shows the specific circuit configuration of a switching element S. The switching element S is formed by connecting a source of PMOS transistor Tr10 and a source of NMOS transistor Tr20 to the reference voltage terminal "$V_{ref}$" and the ground terminal (GND) respectively.

With this configuration, if data "0" obtained by inverting input data "1" is supplied, the switching element S turns on the PMOS transistor Tr10 and turns off the NMOS transistor Tr20, thereby selecting the reference voltage "$V_{ref}$".

On the other hand, if data "1" obtained by inverting input data "0" is supplied, the switching element S turns off the PMOS transistor Tr10 and turns on the NMOS transistor Tr20, thereby selecting 0 V.

The voltage output digital-to-analog converter circuit 10 also has a resistor network formed by connecting, in a so-called "ladder-type" manner, resistors $R10_1$ to $R10_{N-1}$ and resistors $R20_1$ to $R20_{N+2}$ of two types which are selected such that the ratio between their resistance values is 1:2.

More specifically, one ends of the resistors $R20_1$ to $R20_N$ having a resistance value of "2R" are respectively connected to the switching elements $S_1$ to $S_N$. The other end of the resistor $R20_1$ is connected to a junction point of the resistor $R20_{N+1}$ connected to the ground (GND) and having a resistance value of "2R" and the resistor $R10_1$ having a resistance value of "R". The other end of the resistor $R20_2$ is connected to a junction point of the resistor $R10_1$ and the resistor $R10_2$ (not shown) having a resistance value of "R".

The other ends of the succeeding resistors are similarly connected in order. The other end of the resistor $R20_{N-1}$ is connected to a junction point of the resistor $R10_{N-2}$ (not shown) having a resistance value of "R" and the resistor $R10_{N-1}$ having a resistance value of "R". The other end of the resistor $R20_N$ is connected to a junction point of the resistor $R10_{N-1}$ and the resistor $R20_{N+2}$ connected to the ground (GND) and having a resistance value of "2R".

An amplifier 20 for driving a load by keeping output impedance low is connected to a junction point P of the resistors $R20_N$, $R10_{N-1}$, and $R20_{N+2}$.

The voltage output digital-to-analog converter circuit 10 switches the connection state of each of the switching elements $S_1$ to $S_N$ to the reference voltage terminal "$V_{ref}$" or the ground terminal (GND) according to a corresponding one of the bits $b_1$ to $b_N$ of an input digital signal and divides the reference voltage "$V_{ref}$" using the resistor network (the resistors $R10_1$ to $R10_{N-1}$ and $R20_1$ to $R20_{N+2}$), thereby generating an output voltage "$V_{OUT}$" corresponding to the input digital signal, i.e., an output analog signal.

In this case, assuming that only a desired one of the bits of the input digital signal is data "1" and that the ones other than the bit are data "0", a potential "$V_{ai}$" of the junction point P is calculated by:

$$V_{ai} = \frac{V_{ref}}{3} \times \frac{1}{2^{N-i}} \quad (1)$$

As described above, the potential "$V_{ai}$" is calculated for each of ones of the bits which are data "1" using Formula (1). An output voltage "$V_a$", i.e., "$V_{out}$" is calculated by adding the calculated potentials "$V_{ai}$" by:

$$V_{out} = V_a = \frac{V_{ref}}{3} \sum_{i=1}^{N} \frac{b_i}{2^{N-i}} \quad (2)$$

As shown in FIG. 2(b), when each of the PMOS transistor Tr10 and NMOS transistor Tr20 forming the switching element S is turned on, a MOS transistor therein constitutes an on-resistance $R20_{on}$ having a certain resistance value of "$r_{on}$". Note that the on-resistance $R20_{on}$ of the PMOS transistor Tr10 and NMOS transistor Tr20 are designed here to have resistance values equal to each other.

For this reason, the voltage output digital-to-analog converter circuit 10 has the same circuit configuration as one in which the on-resistance $R20_{on}$ is series-connected to a resistor R20 connected to the switching element S. In this case, an error occurs in the output voltage.

Figure 3:
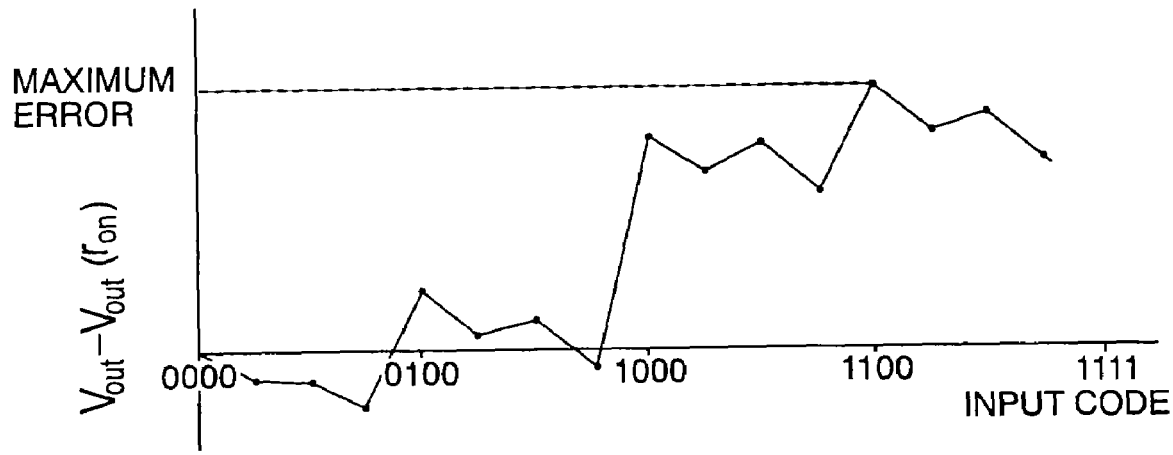
FIG. 3 is an explanatory graph showing a relationship between an input code of a digital signal and an error.

FIG. 3 shows a relationship between an input code of a digital signal and an error ($V_{out}$–$V_{out}(r_{on})$) when, e.g., a 4-bit digital signal is input. Note that "$V_{out}$" represents a ideal value of the output voltage and that "$V_{out}(r_{on})$" represents a value of the output voltage calculated in consideration of the on-resistance $R20_{on}$ of the switching element S.

As shown in FIG. 3, if a 4-bit digital signal is input, the absolute value of the error becomes the maximum when an input code of the digital signal is "1100". The absolute value of the error becomes the maximum when data "1" is supplied as each of the two higher-order bits of the input code, and data "0" is supplied as each of the bits other than the two higher-order bits, regardless of the number of bits, N.

An absolute value $|V_{out} - V_{out}(r_{on})|$ of the maximum error is represented by:

$$|V_{out} - V_{out(r_{on})}| \approx \left| \frac{r_{on} - \frac{a_{N-2} + a_1}{2}}{18R} - \frac{a_1}{12R} + \frac{r_{on} - \frac{a_{N-1}}{2}}{9R} \right| V_{ref} \quad (3)$$

$$a_1 = \frac{r_{on}}{4}$$

$$a_n = \frac{r_{on}(4^n - 1)}{3 \times 4^n} \approx \frac{r_{on}}{3} (n \geq 2)$$

In order for the voltage output digital-to-analog converter circuit 10 to achieve N-bit accuracy, it is desirable to make the absolute value of the maximum error smaller than 1/2×LSB (i.e., 1/2 times the ideal value "$V_{out}$" of the output voltage when only the bit $b_1$(LSB) is data "1").

In other words, to achieve desired accuracy, it is necessary to satisfy:

$$\left| \frac{r_{on} - \frac{a_{N-2} + a_1}{2}}{18R} - \frac{a_1}{12R} + \frac{r_{on} - \frac{a_{N-1}}{2}}{9R} \right| V_{ref} < \frac{1}{2} LSB = \quad (4)$$

$$\frac{1}{2} \times \frac{V_{ref}}{3} \times \frac{1}{2^{N-1}}$$

Formula (4) is simplified as follows:

$$r_{on} < \frac{3}{2^N} R \quad (5)$$

This means that an increase of the accuracy by one bit requires reducing the on-resistance $R20_{on}$ of the switching element S by 1/2 times or increasing the resistance value of "R" by twice. That is, if the switching elements S of the same size are used, the size of each resistor increases by twice, and thus, the area of each chip increases by about twice.

In the voltage output digital-to-analog converter circuit 10, the output voltage is determined by the ratio between the resistance value of the resistors $R10_1$ to $R10_{N-1}$ and that of the resistors $R20_1$ to $R20_{N+2}$. Accordingly, an error which occurs in the output voltage results from series connection of the on-resistance $R20_{on}$ to the resistors $R20_1$ to $R20_N$ connected to the switching elements $S_1$ to $S_N$ and a change in the ratio between the resistance value of the resistors $R20_1$ to $R20_N$, to which the on-resistance $R20_{on}$ are series-connected, and that of the other resistors $R20_{N+1}$ and $R20_{N+2}$ and resistors $R10_1$ to $R10_{N-1}$.

It is possible to keep the ratio between the resistance value of the resistors $R10_1$ to $R10_{N-1}$ and that of the resistors $R20_1$ and $R20_{N+2}$ at 1:2 by series-connecting resistors having a resistance value of $(1/2)r_{on}$ to the resistors $R10_1$ to $R10_{N-1}$ and series-connecting resistors having a resistance value of "$r_{on}$" to the resistors $R20_{N+1}$ and $R20_{N+2}$. In this case, however, the circuit configuration becomes complicated. More specifically, the number of resistors increases or other reference voltage generating circuits are required if each resistor is formed from a MOS transistor.

Figure 4:
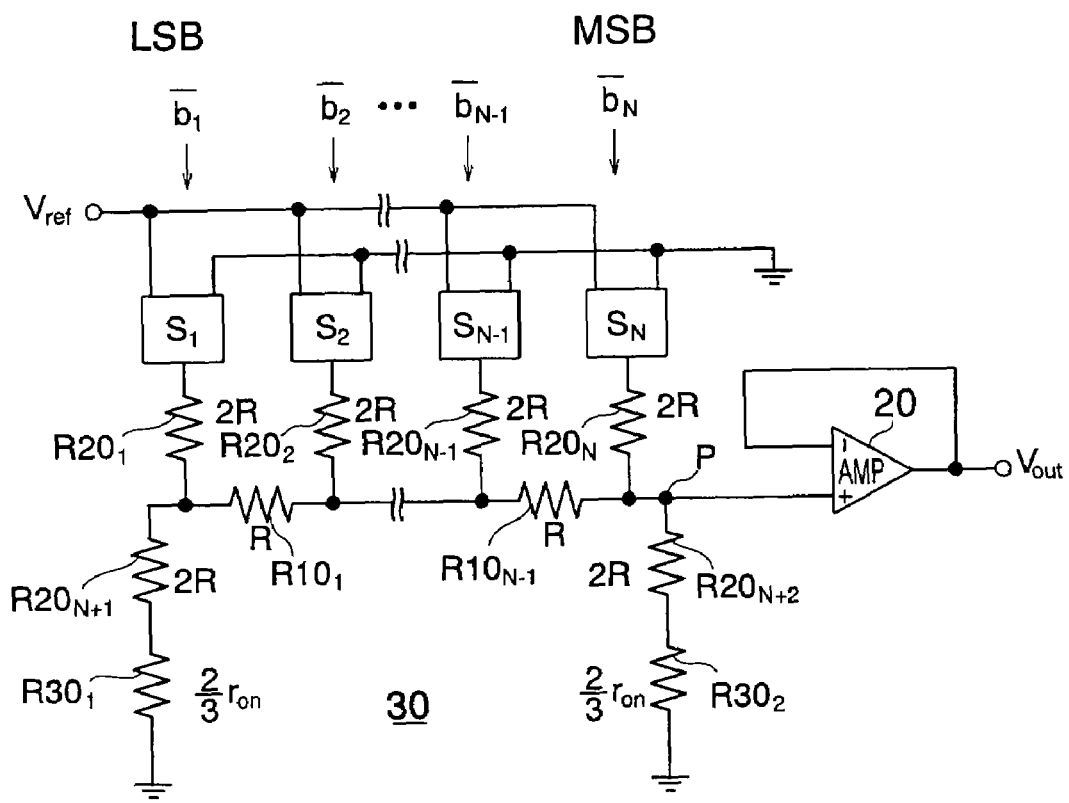
FIG. 4 is a block diagram showing the configuration of a voltage output digital-to-analog converter circuit according to a first embodiment of the present invention.

Accordingly, as shown in FIG. 4, in a voltage output digital-to-analog converter circuit 30 according to this embodiment, correction-resistance $R30_1$ and $R30_2$ having a desired resistance value are connected to the resistors $R20_{N+1}$ and $R20_{N+2}$, which are not connected to the switching elements $S_1$ to $S_N$, in order to reduce the absolute value of a maximum error with a simpler circuit configuration. The optimal value of the resistance value of "$r_0$" of correction-resistance $R30_1$ and $R30_2$ will be calculated below.

The sum of the first and second terms in the right-hand side of Formula (3) described above indicates an error which occurs when only the bit$_{N-1}$, which is the second most significant bit, is data "1". The third term indicates an error which occurs when only the bit $b_N$, which is the MSB (Most Significant Bit), is data "1".

For example, as shown in FIG. 3, where the number of bits of the input code is 4, an error which occurs when the input code is "0100" and one which occurs when the input code is "1000" have the same sign (+). If the input code is "1100", the two errors are added.

Similarly, if the number of bits of the input code is N, an error which occurs when only the bit $b_{N-1}$ is data "1" and one which occurs when only the bit $b_N$ is data "1" have the same sign. If each of the two higher-order bits is data "1", and each of the bits other than the two higher-order bits is data "0", the two errors are added.

Figure 5:
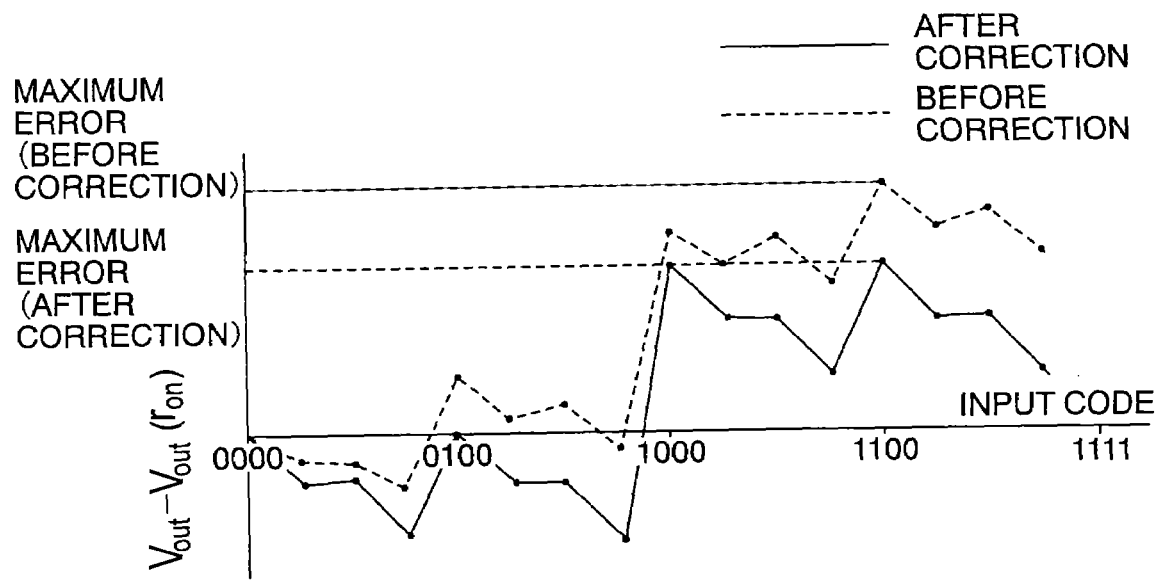
FIG. 5 is an explanatory graph showing relationships before and after correction between an input code of a digital signal and an error.

Accordingly, for example, assume that when the number of bits of the input code is 4, the correction-resistance $R30_1$ and $R30_2$ having the resistance value of "$r_0$", which is adjusted such that an error which occurs when the input code is "0100" becomes "0", are connected to the resistors $R20_{N+1}$ and $R20_{N+2}$. In this case, a plot of the maximum error is wholly shifted upward, as shown in FIG. 5.

For this reason, the absolute value of the maximum error when the input code is "1100" becomes smaller in a case where the correction-resistance $R30_1$ and $R30_2$ are connected to the resistors $R20_{N+1}$ and $R20_{N+2}$ than in a case where the correction-resistance $R30_1$ and $R30_2$ are not connected.

Similarly, if the number of bits of the input code is N, the absolute value of the maximum error can be reduced by adjusting the resistance value of "$r_0$" of the correction-resistance $R30_1$ and $R30_2$ such that an error which occurs when only the bit $b_{N-1}$, which is the second most significant bit, is data "1" becomes "0".

An absolute value $|V_{out} - V'_{out}(r_{on})|$ of the maximum error in the voltage output digital-to-analog converter circuit 30 according to this embodiment is represented by:

$$|V_{out} - V'_{out(r_{on})}| \approx \left| \frac{r_{on} - \frac{a'_{N-2} + a'_1}{2}}{18R} - \frac{a'_1}{12R} + \frac{r_{on} - \frac{a'_{N-1}}{2}}{9R} \right| V_{ref} \quad (6)$$

$$a'_1 = \frac{r_{on} + r_0}{4}$$

-continued
$$a'_n = \frac{r_{on}(4^n - 1)}{3 \times 4^n} + \frac{r_0}{4^n} \approx \frac{r_{on}}{3} (n \geq 2)$$

Note that "$V'_{out}(r_{on})$" represents a value of the output voltage calculated in consideration of the on-resistance $R20_{on}$ of the switching element S when the correction-resistance $R30_1$ and $R30_2$ are connected.

The sum of the first and second terms in the right-hand side of Formula (6) indicates an error which occurs when only the bit $b_{N-1}$, which is the second most significant bit, is data "1". The resistance value of "$r_0$" of the correction-resistance $R30_1$ and $R30_2$ needs to satisfy:

$$\frac{r_{on} - \frac{a'_{N-2} + a'_1}{2}}{18R} - \frac{a'_1}{12R} = 0 \quad (7)$$

If Formula (7) is simplified, the resistance value of "$r_0$" of the correction-resistance $R30_1$ and $R30_2$ is represented by:

$$r_0 = \frac{2}{3} r_{on} \quad (8)$$

If the correction-resistance $R30_1$ and $R30_2$ having the resistance value of "$r_0$" represented by Formula (8) are connected to the resistors $R20_{N+1}$ and $R20_{N+2}$, the absolute value of the maximum error can be reduced.

As described above, in order for the voltage output digital-to-analog converter circuit 30 to achieve N-bit accuracy, it is desirable to make the absolute value $|V_{out} - V'_{out}(r_{on})|$ of the maximum value according to this embodiment smaller than $1/2 \times LSB$ (i.e., 1/2 times the ideal value "$V_{out}$" of the output voltage when only the bit $b_1$(LSB) is data "1").

In other words, it is necessary to satisfy:

$$\left| \frac{r_{on} - \frac{a'_{N-1}}{2}}{9R} \right| V_{ref} < \frac{1}{2} LSB = \frac{1}{2} \times \frac{V_{ref}}{3} \times \frac{1}{2^{N-1}} \quad (9)$$

Formula (9) is simplified as follows:

$$r_{on} < \frac{3}{2^{N-1}} R \quad (10)$$

According to Formula (10) after correction, if the resistance value of "$r_{on}$" of the on-resistance $R20_{on}$ and the resistance value of "R" of the resistors $R10_1$ to $R10_{N-1}$ are equal to those in Formula (5) before correction, the number N of bits of the input code can be increased by one bit, and thus, the accuracy of the output voltage can be increased.

According to Formula (10) after correction, the number N of bits is equal to that in Formula (5) before correction. If the resistance value of "R" equal to that in Formula (5) is used, the resistance value of "$r_{on}$" of the on-resistance $R20_{on}$ can be increased by twice. Since the resistance value of "$r_{on}$" of the on-resistance $R20_{on}$ is inversely proportional to an aspect ratio (W/L) ("W": a channel width, "L": a channel length) of the PMOS transistor Tr10 and the NMOS transistor Tr20, the channel width W can be reduced by, e.g., 1/2 times, and the area of each chip can be reduced.

According to Formula (10) after correction, the number N of bits is equal to that in Formula (5) before correction. If the switching elements S of the same size are used, the resistance value of "R" of the resistors R10$_1$ to R10$_{N-1}$ can be reduced by 1/2 times, and thus, the area of each chip can be reduced.

Second Embodiment

Figure 6:
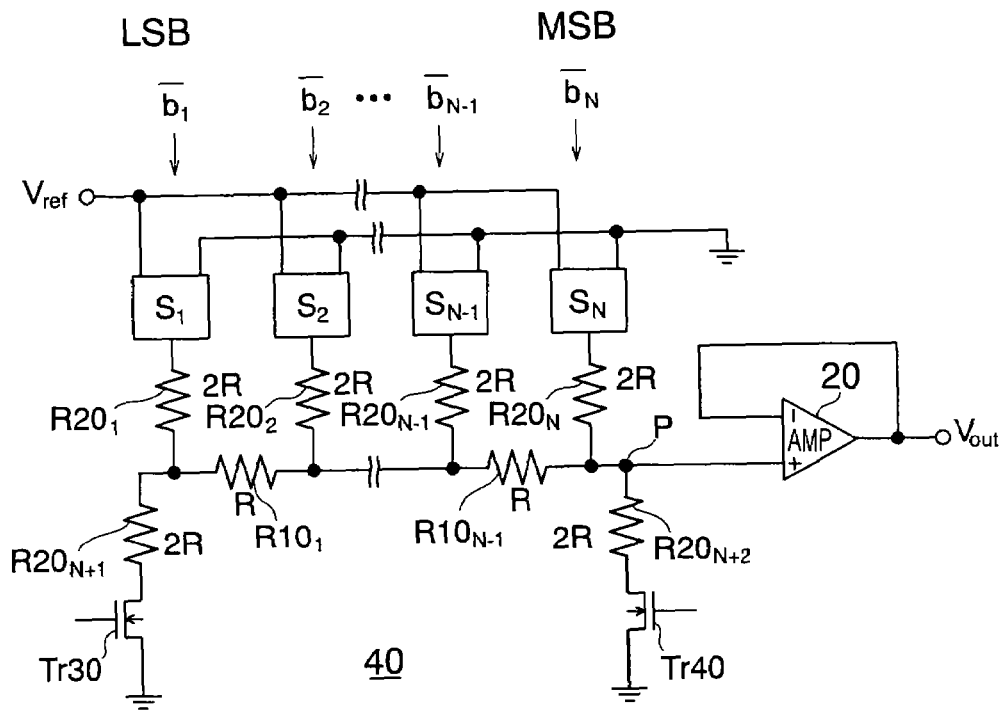
FIG. 6 is a block diagram showing the configuration of a voltage output digital-to-analog converter circuit according to a second embodiment of the present invention.

FIG. 6 shows the configuration of a voltage output digital-to-analog converter circuit 40 according to a second embodiment. The voltage output digital-to-analog converter circuit 40 is formed by connecting NMOS transistors Tr30 and Tr40 to resistors R20$_{N+1}$ and R20$_{N+2}$ which are not connected to switching elements S$_1$ to S$_N$.

Sources of the NMOS transistors Tr30 and Tr40 are connected to a ground (GND), like the NMOS transistor Tr20 forming the switching element S. The same voltage as that in a case where data "1" is supplied to the gate of NMOS transistor Tr20 to turn on the NMOS transistor Tr20 is always applied to gates of the NMOS transistors Tr30 and Tr40. This causes the NMOS transistors Tr30 and Tr40 to be always on. Accordingly, another circuit for generating a reference voltage is not required to turn on the NMOS transistors Tr30 and Tr40.

Note that like the NMOS transistor Tr20 forming the switching element S, a resistance value of "$r_{on}$" of an on-resistance in each of the NMOS transistors Tr30 and Tr40 is represented by:

$$r_{on} = \frac{1}{k \times \frac{W}{L} \times (V_{gs} - V_t)} \quad (11)$$

$k$: constant

In this embodiment, ($V_{gs}$–$V_t$) ("$V_{gs}$": a gate-to-source voltage of an NMOS transistor, "$V_t$": a gate threshold voltage) in Formula (11) has the same value in any of the NMOS transistors Tr30 and Tr40 and NMOS transistor Tr20 forming the switching element S.

Accordingly, the resistance value of "$r_{on}$" of the NMOS transistors Tr30 and Tr40 can be made 2/3 times that of the on-resistance R20$_{on}$ of the NMOS transistor Tr20 forming the switching element S by making an aspect ratio (W/L) ("W": a channel width, "L": a channel length) of the NMOS transistors Tr30 and Tr40 3/2 times that of the NMOS transistor Tr20 forming the switching element S.

Note that the element area of an MOS transistor is generally smaller than that of a resistor. Accordingly, if the NMOS transistors Tr30 and Tr40 are connected to the resistors R20$_{N+1}$ and R20$_{N+2}$, which are not connected to the switching elements S$_1$ to S$_N$, as in this embodiment, the area of each chip can be made smaller than that of the first embodiment, in which the correction-resistance R30$_1$ and R30$_2$ are connected.

Note that the above-described embodiments are merely examples and not intended to limit the present invention. In the embodiments, the switching element S is formed by, e.g., connecting the source of PMOS transistor Tr10 and source of NMOS transistor Tr20 to the reference voltage terminal "$V_{ref}$" and the ground terminal (GND) respectively. Various other switching elements may be used instead.

What is claimed is:

1. A voltage output digital-to-analog converter circuit, comprising:
    a plurality of switching elements provided corresponding to respective bits of an input digital signal to switch connection states of the plurality of switching elements to either the reference voltage terminal or the ground terminal according to the bits of the input digital signal; and
    a resistor network which includes first resistive elements and second resistive elements having a resistance value twice a resistance value of the first resistive elements and in which one ends of the second resistive elements are connected to the plurality of switching elements respectively, the first resistive elements are connected between neighboring pairs of the other ends of the second resistive elements respectively, and other ones of the second resistive elements and third resistive elements having a desired resistance value are series-connected between the other ends of the second resistive elements, which are connected to switching elements of the plurality of switching elements to which a most significant bit and a least significant bit are supplied, and the ground.

2. The voltage output digital-to-analog converter circuit according to claim 1, wherein
    each of the switching element is formed by connecting a source of first transistor and a source of second transistor to the reference voltage terminal and the ground terminal respectively and connecting the one end of the second resistive element to a junction point of the drain of first and second transistors.

3. The voltage output digital-to-analog converter circuit according to claim 2, wherein
    the first and second transistors are formed such that resistance values of on-resistance are equal to each other.

4. The voltage output digital-to-analog converter circuit according to claim 2, wherein
    the first transistor is composed of a PMOS transistor, and the second transistor is composed of an NMOS transistor.

5. The voltage output digital-to-analog converter circuit according to claim 1, wherein
    each of the third resistive element has a resistance value which is 2/3 times a resistance value of on-resistance of the plurality of switching elements.

6. The voltage output digital-to-analog converter circuit according to claim 1, wherein
    each of the third resistive element is a third transistor which has an on-resistance having a resistance value 2/3 times a resistance value of on-resistance of the plurality of switching elements.

7. The voltage output digital-to-analog converter circuit according to claim 6, wherein
    the third transistor is composed of an NMOS transistor.

8. The voltage output digital-to-analog converter circuit according to claim 6, wherein
    a voltage equal to a voltage applied to the gate of second transistor is always applied to a gate of the third transistor, and thereby the third transistor is set to be on.

9. The voltage output digital-to-analog converter circuit according to claim 6, wherein
    each of the switching element is formed by connecting a first transistor and a second transistor to the reference voltage terminal and the ground terminal respectively and connecting the one end of the second resistive element to a junction point of the drain of first and second transistors.

10. The voltage output digital-to-analog converter circuit according to claim 9, wherein
the third transistor is formed to have an aspect ratio which is 3/2 times an aspect ratio of the second transistor.

11. The voltage output digital-to-analog converter circuit according to claim 1, further comprising
an amplifier connected to a junction point of the second resistive element connected to the switching element, to which the most significant bit is supplied, and the first resistive element.

12. A voltage output digital-to-analog converter circuit, comprising:
a plurality of switching elements provided corresponding to respective bits of an input digital signal to switch connection states of the plurality of switching elements to either the reference voltage terminal or the ground terminal according to the bits of the input digital signal; and
a resistor network which includes first resistive elements and second resistive elements having a resistance value twice a resistance value of the first resistive elements and in which one ends of the second resistive elements are connected to the plurality of switching elements respectively, the first resistive elements are connected between neighboring pairs of the other ends of the second resistive elements respectively, and other ones of the second resistive elements and correction transistors each having an on resistance with a desired resistance value are series-connected between the other ends of the second resistive elements, which are connected to switching elements of the plurality of switching elements to which a most significant bit and a least significant bit are supplied, and the ground.

13. The voltage output digital-to-analog converter circuit according to claim 12, wherein
each of the switching element is formed by connecting a source of first transistor and a source of second transistor to the reference voltage terminal and the ground terminal respectively and connecting the one end of the second resistive element to a junction point of the drain of first and second transistors.

14. The voltage output digital-to-analog converter circuit according to claim 13, wherein
the first and second transistors are formed such that resistance values of on-resistance are equal to each other.

15. The voltage output digital-to-analog converter circuit according to claim 13, wherein
the first transistor is composed of a PMOS transistor, and the second transistor is composed of an NMOS transistor.

16. The voltage output digital-to-analog converter circuit according to claim 12, wherein
each of the correction transistor has an on-resistance having a resistance value which is 2/3 times a resistance value of on-resistance of the plurality of switching elements.

17. The voltage output digital-to-analog converter circuit according to claim 12, wherein
the correction transistor is composed of an NMOS transistor.

18. The voltage output digital-to-analog converter circuit according to claim 13, wherein
a voltage equal to a voltage applied to the gate of second transistor is always applied to a gate of the correction transistor, and thereby the correction transistor is set to be on.

19. The voltage output digital-to-analog converter circuit according to claim 13, wherein
the correction transistor is formed to have an aspect ratio which is 3/2 times an aspect ratio of the second transistor.

20. The voltage output digital-to-analog converter circuit according to claim 12, further comprising
an amplifier connected to a junction point of the corresponding second resistive element connected to the switching element, to which the most significant bit is supplied, and the corresponding first resistive element.

* * * * *